United States Patent
Cohen et al.

(10) Patent No.: US 6,414,377 B1
(45) Date of Patent: *Jul. 2, 2002

(54) LOW K DIELECTRIC MATERIALS WITH INHERENT COPPER ION MIGRATION BARRIER

(75) Inventors: Stephan Alan Cohen, Wappingers Falls; Claudius Feger, Croton-on-Hudson, both of NY (US); Jeffrey Curtis Hedrick, Park Ridge, NJ (US); Jane Margaret Shaw, Branford, CT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/371,340

(22) Filed: Aug. 10, 1999

(51) Int. Cl.[7] .................... H01L 23/58; H01L 23/48
(52) U.S. Cl. ................... 257/642; 257/643; 257/762
(58) Field of Search ................ 257/637, 640, 257/642, 643, 758, 759, 762; 438/118, 622, 82, 725, 780

(56) References Cited

U.S. PATENT DOCUMENTS 5,760,480 A * 6/1998 You et al. .................... 257/783
5,872,402 A * 2/1999 Hasegawa .................... 257/758

FOREIGN PATENT DOCUMENTS

JP    63-73660    * 4/1988

* cited by examiner

Primary Examiner—Steven Loke
Assistant Examiner—Hung Kim Vu
(74) Attorney, Agent, or Firm—Scully, Scott, Murphy & Presser; Daniel P. Morris

(57) ABSTRACT

An interlayer dielectric for preventing Cu ion migration in semiconductor structure containing a Cu region is provided. The interlayer dielectric of the present invention comprises a dielectric material that has a dielectric constant of 3.0 or less and an additive which is highly-capable of binding Cu ions, yet is soluble in the dielectric material. The presence of the additive in the low k dielectric allows for the elimination of conventional inorganic barrier materials such as $SiO_2$ or $Si_3N_4$.

21 Claims, 3 Drawing Sheets

LOW K DIELECTRIC MATERIALS WITH INHERENT COPPER ION MIGRATION BARRIER

FIELD OF THE INVENTION

The present invention relates to integrated circuits (ICs), and in particular to an interlayer dielectric which is capable of reducing or eliminating copper (Cu) ion migration in ICs. The interlayer dielectric of the present invention comprises a low dielectric constant dielectric material (k of 3.0 or less) that is modified to include an additive that has a high affinity for Cu ions, yet is soluble in the dielectric matrix.

PRIOR ART

In current IC chip designs which utilize copper (Cu) lines and organic, low k dielectrics as an interlayer dielectric, Cu ion migration barriers are typically made of high dielectric constant (k greater than 3.0) inorganic dielectrics such as silicon nitride or silicon dioxide. These inorganic dielectrics which are typically positioned between the interlayer dielectric and the Cu lines are used to reduce or eliminate Cu ion migration under electrical bias. Cu ion migration under electrical bias can occur under typical working conditions of the IC chip over a long period of time. Shorting of the circuits which is caused by Cu ion migration determines the useful life of the chip.

Presently, Cu ion migration barriers have high dielectric constants associated therewith. Typically, the dielectric constants of prior art Cu ion migration barriers are greater than 3.0, preferably 7.0 or above. The utilization of such high dielectric constant Cu ion migration barriers is not practical with today's generation of IC chips; the employment of the same increases the overall dielectric constant of the IC chip, i.e. the sum of the dielectric constant of the ion migration barrier layer plus that of the interlayer dielectric (ILD) times their respective thickness. The higher the dielectric constant of the ILD, the lower the performance of the chip.

As stated above, prior art Cu ion migration barriers are used in conjunction with low k ILDs. The manufacture of separate dielectric barrier layers not only increases the overall dielectric constant deteriorating chip performance, but also adds additional processing steps which add to the complexity and cost of chip manufacturing.

To date, no successful use of only a low k ILD as a Cu ion migration barrier has been realized since such materials readily permit Cu ion migration. Despite this problem, low k dielectrics are extremely advantageous since the use of the same does not significantly increase the dielectric constant of the entire IC chip. There is thus a need to develop new low k dielectrics which can serve as both the interlayer dielectric and as a Cu ion migration barrier in reducing or eliminating Cu ion migration in IC chips containing Cu wiring.

SUMMARY OF THE INVENTION

One object of the present invention is to provide a low k dielectric material which can be used as an interlayer dielectric, yet is capable of reducing and/or eliminating Cu ion migration in IC chips containing Cu wiring.

A further object of the present invention is to pro vide a low k dielectric material which increases the lifetime of high-speed IC chips.

A still further object of the present invention is to provide a low k dielectric (serving as both the interlayer dielectric and Cu ion migration barrier) that is easy to fabricate, yet does not add additional processing steps and costs in IC manufacturing.

A yet further object of the present invention is to provide IC chips in which Cu ion migration has been significantly reduced or eliminated.

These and other objects and advantages can be obtained in the present invention by utilizing a low k dielectric material which includes a modifier therein that inherently prevents Cu ions from migrating there through. The utilization of such a dielectric material, as the interlayer dielectric, eliminates the need of employing a separate inorganic barrier layer to prevent Cu ion migration. Elimination of inorganic Cu ion migration barrier layers reduces processing steps and cost in IC processing as well as avoiding the use of high dielectric materials which serve to increase the overall dielectric constant of the IC chip.

Specifically, one aspect of the present invention relates to a new interlayer dielectric which comprises a dielectric material having a dielectric constant of 3.0 or less, said dielectric material including an additive which has a high affinity for binding (or completing) Cu ions, yet being soluble in said dielectric material. The presence of the additive in the dielectric material allows the inventive interlayer dielectric to be used as a barrier layer preventing Cu ion migration without significantly increasing the dielectric constant of the ILD.

Another aspect of the present invention relates to semiconductor structures, particularly IC chips, which include the above described interlayer dielectric therein. Specifically, the present invention provides an IC structure comprising: a substrate, the interlayer dielectric of the present invention formed on said substrate, a Cu region formed on or within said interlayer dielectric, and a passivation layer formed on said Cu region. The final IC chip interconnect structure may contain many layers of interlayer dielectrics and a signal or reference plane patterns and Cu vias.

A further object of the present invention is to provide a method of forming an IC structure which contains the interlayer dielectric of the present invention therein. In accordance with this aspect of the present invention, the method comprises forming the interlayer dielectric of the present invention on the surface of a substrate; forming a Cu region on or within said interlayer dielectric; and forming a passivation layer on said Cu region.

It is also within the scope of the present invention to use the interlayer dielectric of the present invention in conjunction with separate inorganic ion migration barrier layers. In this optional embodiment of the present invention, the thickness of the inorganic barrier layer can be significantly reduced so that the overall dielectric constant of the structure is not substantially increased from that of the interlayer dielectric. Although the use of a separate inorganic Cu ion migration barrier layer is not necessary, it may be used to provide additionally prevention against Cu ion migration.

BRIEF DESCRIPTION OF THE DRAWINGS

In FIG. 1a, the Cu is formed on the interlayer dielectric; and in FIG. 1b the Cu is formed in the interlayer dielectric.

DETAILED DESCRIPTION OF THE INVENTION

Figure 1A:
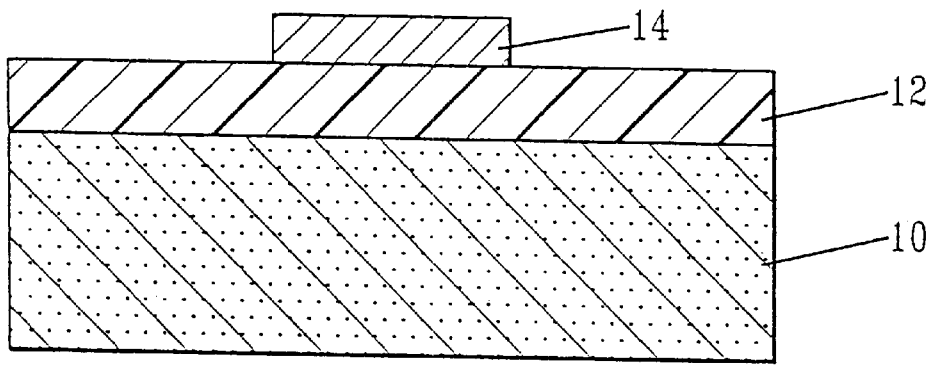
FIGS. 1a–1b are cross-sectional views of semiconductor structures of the present invention wherein an interlayer dielectric 12 is sandwiched between a substrate 10 and an area of Cu 14.

The present invention, which provides a new interlayer dielectric having an additive for binding Cu ions therein, will now be described in greater detail by referring to the drawings that accompany the present application. It is noted that in these drawings like reference numerals are used for describing like and/or corresponding elements.

Figure 1B:
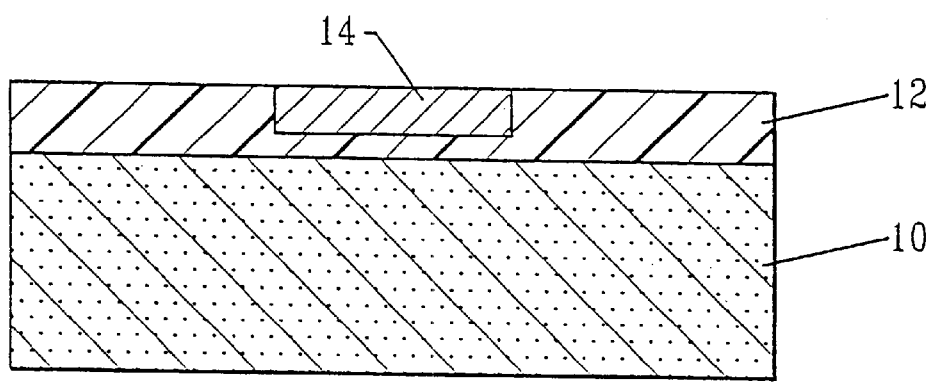

Reference is first made to FIGS. 1a–1b which illustrate basic semiconductor structures that can contain the interlayer dielectric of the present invention therein. Specifically, the semiconductor structures of FIGS. 1a–1b comprise a substrate 10, an interlayer dielectric 12 of the present invention formed on substrate 10 and an area of Cu 14 formed on or, alternatively, in said inventive interlayer dielectric.

Substrate 10 may be a semiconductor chip, wafer or interconnect structure in which a Cu wiring level can be formed thereon. The substrate may be composed of, or contain a semiconducting material such as Si, Ge, GaAs, InAs, InP or another III/V compound. The substrate may contain active device regions, wiring regions, isolation regions or other like regions therein. For clarity these regions are not shown in the drawings, but are nevertheless intended to be included in substrate 10.

To at least one surface of substrate 10, there is applied interlayer dielectric 12. The interlayer dielectric 12 is applied to one surface of substrate 10 by using standard deposition techniques including: chemical vapor deposition, sputtering, plasma-assisted chemical vapor deposition, spinon coating and other like deposition processes. The thickness of the interlayer dielectric is not critical to the present invention, but typically it is applied to a thickness of from about 0.1 to about 1.0 $\mu$m.

Interlayer dielectric 12 is unlike prior art interlayer dielectrics in that it contains an additive therein which is present in an amount effective to bind Cu ions, yet still rendering the additive soluble in the dielectric matrix. Specifically, interlayer dielectric 12 comprises a low dielectric constant dielectric and an additive. The term "low dielectric constant" is used herein to denote a dielectric having a dielectric constant, i.e. k value, of 3.0 or less, preferably less than 2.6.

Suitable low k dielectrics that may be used in the present invention include any conventional organic dielectric material which falls within the range of k values mentioned above. Illustrative examples of some organic dielectric materials that can be used in the present invention include, but are not limited to: polyimdes, polyamides, diamond, diamond-like carbon, silicon-containing polymers, polyarylene ethers (thermosetting or non-thermosetting), paralyene polymers and other like organic dielectrics having a dielectric constant of 3.0 or less.

The additive which is used in conjunction with the low k dielectric material must satisfy the following two conditions: (i) it must be capable of forming a strong bond with Cu ions, i.e. it must have a high affinity for Cu ions therefore forming a strong complex with Cu ions; and (ii) it must be soluble in the low K dielectric material thereby being essentially uniformly distributed throughout the dielectric matrix. Illustrative additives that may be used in conjunction with the low k dielectric include: mercapto compounds, sulfur compounds, sulfide compounds, cyanide compounds, multidentate ligands, polymeric compounds and other like additives that have a strong binding affinity for Cu. It is noted that the term "compound" includes derivatives of the above mentioned additives. A preferred additive employed in the present invention is a phthalocyanine compound.

The additive is added to the low k dielectric prior to deposition of the same using conventional solution chemistry which is capable of providing a premixed interlayer dielectric composition wherein the additive is uniformly distributed in the low k dielectric matrix. Specifically, the premix is obtained by dissolving the additive in a solution of the dielectric or a precursor of the dielectric. Other possible means for obtaining the above premix can also be used.

It is noted that the amount of additive employed in the present invention should be sufficient to satisfy conditions (i)–(ii) mentioned above. That is, the amount of additive must provide sufficient Cu ion binding while still being soluble in the dielectric matrix. These conditions are achieved if the additive is used in amounts not to exceed $10^{-8}$ moles. Preferably, the additive is present in an amount so that from about $10^{-6}$ to about $10^{-8}$ moles of additive are present in the entire matrix of the low k dielectric material. It is further noted that the amount of additive employed in the present invention does not substantially increase the dielectric constant of the low k material.

Cu region 14 is then formed on the surface of the interlayer dielectric, as shown in FIG. 1a or within the interlayer dielectric as shown in FIG. 1b. The Cu region, which may be patterned as shown in FIG. 1a or unpatterned, is formed on the surface of the interlayer dielectric by depositing a layer of Cu thereon. Cu deposition is carried out utilizing a conventional deposition process that is capable of forming a layer of Cu on the surface of an interlayer dielectric. Examples of suitable deposition processes that can be used in forming a Cu layer include: chemical vapor deposition, plasma-assisted chemical vapor deposition, sputtering, evaporation, plating and other like deposition processes. The overall thickness of the Cu region is not critical to the present invention, but generally the thickness of Cu region 14 is from about 0.1 to about 2 microns. If a patterned Cu region is desirable, patterning can be achieved utilizing conventional lithography, reactive ion etching and other etching processes.

FIG. 1b illustrates a further embodiment of the present invention wherein Cu region 14 is formed within interlayer dielectric 12. This structure is formed utilizing conventional processes that are capable of first forming a trench (or via) in the interlayer dielectric, filling the trench with Cu, and, if necessary, polishing any Cu not deposited in the trench. The trench and via may be formed by conventional lithography and etching (e.g., reactive ion etching) and the trench is then filled with Cu using any of the above mentioned Cu deposition processes. Polishing may be carried out by chemical-mechanical polishing or grinding.

Figure 2:
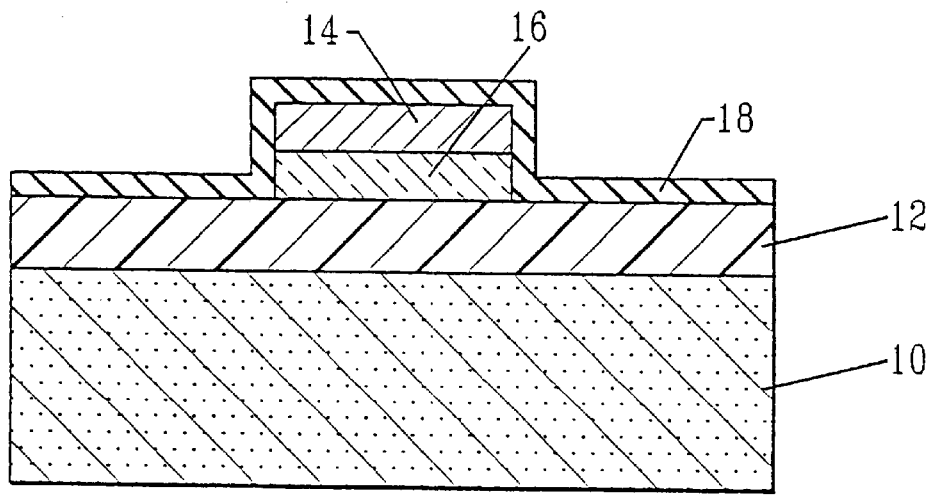
FIG. 2 is a cross-sectional view of the structure of FIG. 1a including an optional inorganic barrier layer 16 and an optional passivation layer 18.

FIG. 2 illustrates some further embodiments of the present invention wherein an optional inorganic barrier layer 16 and a passivation layer 18 are employed. Although illustration is given for both, it is also within the scope of the present invention to utilize either the passivation layer or the inorganic barrier layer. It is also possible to use multiple layers of these elements or to use the same in conjunction with the structure shown in FIG. 1b.

In instances when an inorganic barrier layer (16) such as SiO$_2$ or Si$_3$N$_4$ is employed, it is generally formed between interlayer dielectric 12 and Cu region 14 utilizing convention deposition processes such as chemical vapor deposition. Inorganic barrier layer 16 may be patterned or unpatterned.

The presence of both the interlayer dielectric of the present invention and the inorganic barrier layer provides dual protection from Cu ion migration. It is noted that since the inventive interlayer dielectric inherently contains an additive therein that has a strong binding affinity for Cu, the thickness of the inorganic barrier layer can be reduced from 700 nm (representative of the prior art) to 350 nm or less. At a thickness of 350 nm or less, the overall dielectric constant of the structure is not affected in any way.

When a passivation layer 18 is employed, it is formed so as to isolate Cu region 14; therefore it may be formed on top of Cu region 14 and/or on any exposed sidewalls thereof. Suitable passivation materials that can be employed in the present invention include: polyimides, polysilicon, SiO$_2$, Si$_3$N$_4$, metal barriers such as Ti, Ta, TaN, WN, and other like materials which are capable of insulating the Cu region from an overlying layer that may be formed thereon. The thickness of the passivation layer is not critical to the present invention, but typically the thickness of such layers is from about 200 Å to about 1 micron.

The present examples are given to illustrate the present invention and to demonstrate some advantages that can arise from utilizing the same.

EXAMPLE

In this example, the following studies were performed on structures which contained the interlayer dielectric of the present invention, i.e. thermosetting polyarylene ether containing a phthalocyanine derivative, i.e. 2, 9, 16, 23-tetra-tert-butyl-29H, 31H phthalocyanine, as an additive, and comparison was made to structures that contained a conventional unmodified interlayer low k dielectric (thermosetting polyarylene ether without an additive).

Bias Thermal Stress (BTS) Test

BTS tests were used as an accelerated reliability test method for degradation of the above-mentioned interlayer dielectrics.

Figure 3:
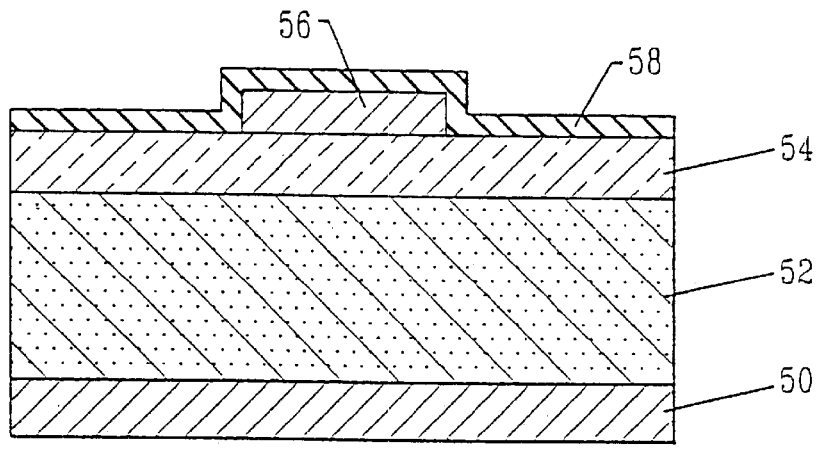
FIG. 3 is a cross-sectional view illustrating a capacitor structure which is used in the present invention in measuring Cu and Al migration.

To measure the metallic ion migration through the above-mentioned dielectric materials, a capacitor structure such as shown in FIG. 3 was employed. Specifically, the structure shown in FIG. 3 comprises a bottom W electrode 50, a Si substrate 52, an interlayer dielectric 54, Cu or Al electrode 56, and Si$_3$N$_4$ layer 58.

In the test, a voltage of about 2 MV/cm was applied across the structure of FIG. 3. If the breakdown voltage was below 2 MV/cm, lower voltages were used. After the voltage is applied, the structure is heated to a temperature of about 300° C. for a time period of about 10 minutes.

Bias on the gate can be positive or negative. It is positive to drive Cu ions into and through the interlayer dielectric. Reverse bias was used to check if the process was reversible. Typically samples remain under bias during cooling.

After BTS, changes that may have occurred in the sample due to ion migration can be assessed by using the following electrical tests.

Capacitance-Voltage (CV) Tests

CV tests, also called CV shift test, provide a fast sensitive technique for observing the results of transport of ions within insulators. This test is performed at room temperature.

In the CV test, the ac capacitance of the device is measured as a function of a varying dc bias voltage at room temperature. These test conditions typically do not disturb the state of the sample arrived at during BTS. The recorded capacitance-voltage (CV) plot is compared to the same plot obtained before BTS. A negative shift in the flatband voltage curve indicates that cation migration is likely to have occurred.

Mobile charges such as ions can be present in the insulator. After BTS these charges can reach the Si/insulator interface. These extra charges are additive to the applied field voltage and are the origin of the shift in the C-V curve along the voltage axis to more negative voltages.

C-V shifts result from a change in ionic space charge distribution in the insulator. That is, all mobile space charges lead to C-V shifts. Thus the presence of a significant amount of native charges (impurities) in the insulator can mask migration caused by injection of ions from the electrode into the insulator.

The measured flatband voltage shift can be used as a measure of the amount of charges drifting into the dielectric. These charges may be effects of either insulator instabilities and/or alkali metal migration. It is possible to calculate the ion concentration that reaches the thermal oxide/Si interface by using $$[\text{ion+}] = -(C_{OX}/q)\Delta V_{FB}$$

where $C_{OX}$ is the dielectric stack capacitance per unit area and q is the electronic charge. The ion drift rate in the dielectric and the corresponding activation energy can be obtained by following $\Delta V_{FB}$ as a function of time and temperature. In this latter procedure there is some arbitrariness since large $\Delta V_{FB}$ values (the definition of large is arbitrary) must be ignored since the presence of large amounts of ions in the dielectric change the electric fields in the dielectric during stressing. In the presence of impurities such as sodium ions in the dielectric, the attempt has been made to ignore the initial, more rapid change in $V_{FB}$ hoping that subsequently the time dependent flat band voltage shift will be only indicative of ions injected from the electrode. While this procedure might be acceptable in structures without barrier layers as long as significant amounts of ions are injected from the electrode, it is likely too inaccurate for structures with barrier layers. Clearly a procedure that would separate unarbitrarily between the various ion species would be preferable.

The kinetics of the ion migration process can be studied if one follows the C-V shift of samples exposed to bias for various lengths of time at a given elevated temperature or for a fixed time at various temperatures. The flatband voltage shifts are, for instance, plotted versus the stress time. From the slopes of these curves drift rates (in ions/cm$^2$ sec) of Cu ions can be extracted.

Under certain circumstances stress (e.g. changing stress or growth of interface defects) the shape of the CV curve can change after BTS. In this case an apparent CV shift might be reported even though no ionic migration takes place. CV shifts can also occur due to annealing of damages in the dielectric. The latter can be ruled out if samples are annealed without bias before the first CV flatband curve is measured. In all the above cases the voltage shift $\Delta V$ is measured at the midgap capacitance of the fore and after BTS curves. To avoid such misinterpretations it is useful to report the density state. This value gives a quality of measure of the CV curve. In this case one monitors the CV stretch out as a result of interface state creation during stressing. From such observations one can ensure that a given observed CV shift is related to charge migration and not other phenomena such as are mentioned above.

Triangular Voltage Sweep (TVS)

This test has only recently been developed in order to avoid some of the pitfalls of the CV test. While the CV test is performed at room temperature, the TVS test is performed at the bias temperature, i.e., at a temperature where the ions are mobile. Thus under the applied dc voltage the movement of the ions produces a current which changes while the voltage changes from positive to negative. The species of ions that move depend on the applied voltage. For instance, as the voltage drops the current caused by alkali ions is observed first. This is followed by copper ions, which is followed by hydrogen ion movement which is activated under these conditions; this is a secondary proton movement on top of the one that occurred during previous stressing.

If the TVS test is preceded by a BTS test a significant part of the native positive charges (impurities) have been pushed to the insulator/silicon interface, so that the observed current is due to the ions injected from the electrode into the insulator on top of the displacement current of the capacitor under test. The current due to copper ion migration manifests itself as a shoulder on the current caused by hydrogen ion movement.

Figure 4A:
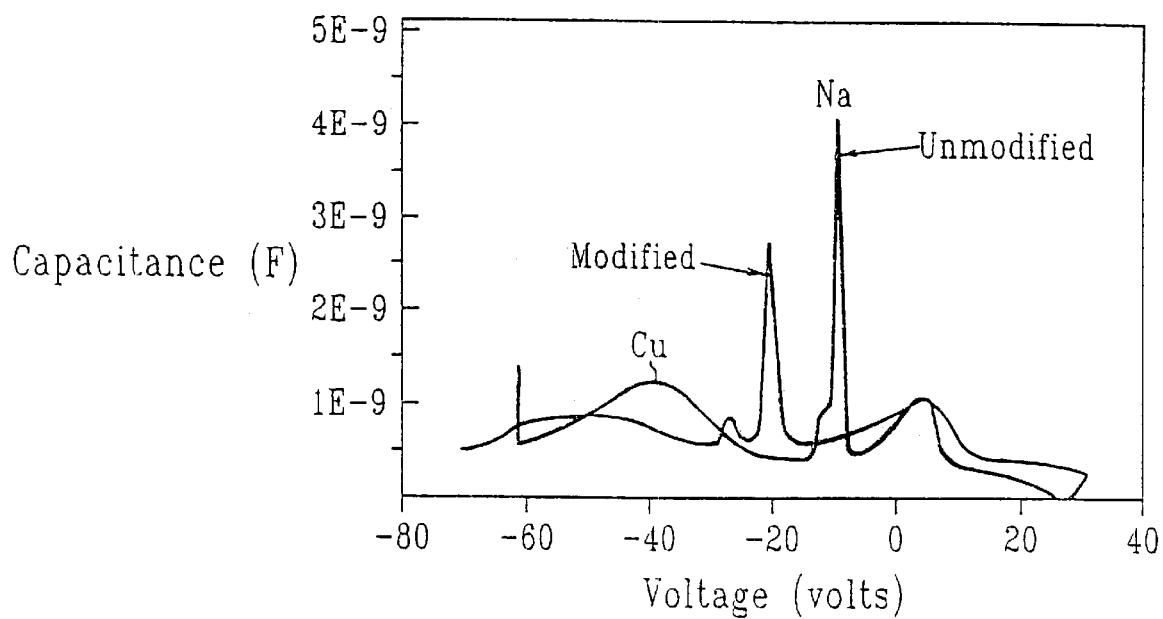
FIGS. 4a–4b are plots of triangular voltage sweep (TVS) curves of a structure described in FIG. 3 in which the metal is Cu (4a) and Al (4b). Both an unmodified interlayer dielectric (comparative example) and a modified-interlayer dielectric (present invention) are shown.
Figure 4B:
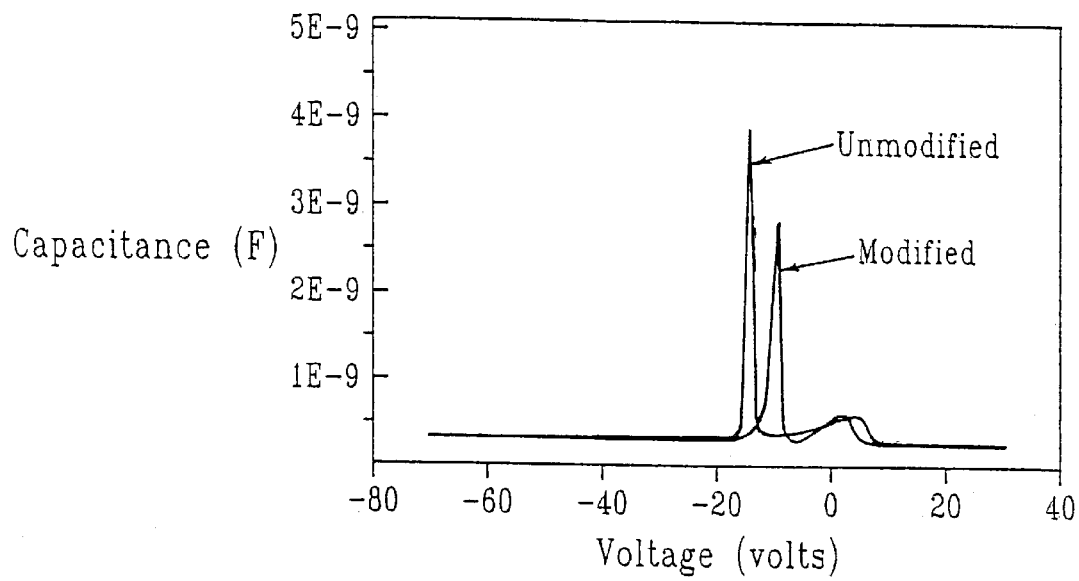
Figure 5:
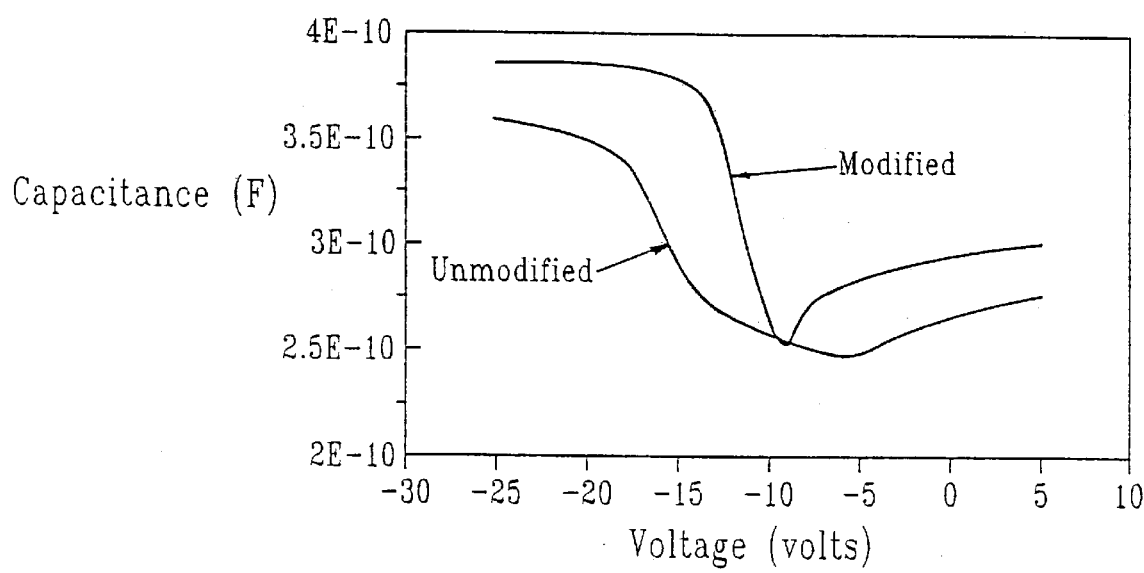
FIG. 5 is a capacitance (C) vs. voltage (V) plot of an unmodified interlayer dielectric and a modified interlayer dielectric according to the present invention.

Results:

FIG. 4a shows a comparison between the control dielectric and the dielectric containing a soluble phthalocyanine derivative additive for a structure with copper electrode. The control shows a large, sharp sodium ion peak followed by a large, broad copper ion peak when changing the voltage from positive to negative. In comparison, the modified film shows a reduced sodium peak at lower voltage and a very much reduced copper peak. From the areas under the copper peaks it can be calculated that the control shows a factor of 4 higher copper diffusivity under the same stress condition than the modified PAE. (1.2 E+12 for the control to 3 E+11 for the modified film) The same TVS plot measured for aluminum electrodes (FIG. 4b) shows again the shift of the sodium ions to lower voltages which indicates a drop in diffusivity for sodium as well. This experiment shows that the peaks at −40 volts in FIG. 4a originate from the migration of copper ions. The C-V curve of modified and control dielectric (FIG. 5) show that the modified films are more stable, i.e., less charge is generated during the bake. However, the capacitance is higher, likely due to slightly higher dielectric constant of the modified film.

While the present invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms described and illustrated but fall within the scope of the appended claims.

Having thus described our invention in detail, what we claim as new and desire to secure by the Letters Patent is:

1. An interlayer dielectric which is capable of reducing or eliminating Cu ion migration comprising a dielectric material having a dielectric constant of 3.0 or less and an additive selected from the group consisting of sulfur compounds, sulfide compounds, cyanide compounds, multidentate ligands and polymeric compounds, said additive being capable of binding Cu ions, being soluble in said dielectric material and being substantially, uniformly distributed throughout said dielectric.

2. The interlayer dielectric of claim 1 wherein said dielectric material is an organic dielectric material.

3. The interlayer dielectric of claim 2 wherein said organic dielectric is selected from the group consisting of polyimides, polyamides, diamond, diamond like carbon, silicon-containing polymers, polyarylene ethers and paralyene polymers.

4. The interlayer dielectric of claim 1 wherein said additive is a phthalocyanine compound.

5. The interlayer dielectric of claim 1 wherein said additive is present in an amount of from $10^{-8}$ moles or less.

6. The interlayer dielectric of claim 5 wherein said additive is present in an amount of from about $10^{-6}$ to about $10^{-8}$ moles.

7. A semiconductor structure comprising a substrate, the interlayer dielectric of claim 1 formed on said substrate and a Cu region in contact with said interlayer dielectric.

8. The semiconductor structure of claim 7 further comprising a passivation layer formed on said Cu region.

9. The semiconductor structure of claim 7 wherein said Cu region is formed on said interlayer dielectric or inside a trench formed in said interlayer dielectric.

10. The semiconductor structure of claim 7 wherein said dielectric material is an organic dielectric material.

11. The semiconductor structure of claim 10 wherein said organic dielectric is selected from the group consisting of polyimides, polyamides, diamond, diamond like carbon, silicon-containing polymers, polyarylene ethers and paralyene polymers.

12. The semiconductor structure of claim 7 wherein said additive is a phthalocyanine compound.

13. The semiconductor structure of claim 7 wherein said additive is present in an amount of from $10^{-8}$ moles or less.

14. The semiconductor structure of claim 13 wherein said additive is present in an amount of from about $10^{-6}$ to about $10^{-8}$ moles.

15. The semiconductor structure of claim 7 wherein said interlayer dielectric has a thickness of from about 0.1 to about 1.0 $\mu$m.

16. The semiconductor structure of claim 7 further comprising an optional inorganic barrier layer formed between said interlayer dielectric and said Cu region.

17. The semiconductor structure of claim 16 wherein said optional inorganic barrier layer is $SiO_2$ or $Si_3N_4$.

18. The semiconductor structure of claim 16 wherein said optional inorganic barrier layer has a thickness of from about 200 Å to about 1 micron.

19. The semiconductor structure of claim 7 wherein said substrate is a semiconductor chip, wafer or interconnect structure.

20. The semiconductor structure of claim 7 wherein said substrate comprises, or contains, a semiconducting material selected from the groups consisting of Si, Ge, GaAs, InAs, InP and other III/V compounds.

21. The semiconductor structure of claim 7 wherein said Cu region is patterned or unpatterned.

* * * * *

UNITED STATES PATENT AND TRADEMARK OFFICE
CERTIFICATE OF CORRECTION

PATENT NO. : 6,414,377 B1
DATED : July 2, 2002
INVENTOR(S) : Stephan A. Cohen

It is certified that error appears in the above-identified patent and that said Letters Patent is hereby corrected as shown below:

Column 1,
Line 60, "pro vide" should read -- provide --

Column 2,
Line 19, "completing" should read -- complexing --

Signed and Sealed this

Thirty-first Day of December, 2002

JAMES E. ROGAN
*Director of the United States Patent and Trademark Office*